United States Patent [19]

Aoki et al.

[11] 4,254,665

[45] Mar. 10, 1981

[54] PUSH-BUTTON TYPE TUNING APPARATUS

[75] Inventors: Toshio Aoki, Yokohama; Atsumi Takayama, Hachiohji; You Matsuuchi, Kawasaki; Mikito Baba, Yokohama; Kenichiro Kawazoe, Fuchu, all of Japan

[73] Assignee: Mitsumi Electric Co., Ltd., Chofu, Japan

[21] Appl. No.: 26,758

[22] Filed: Apr. 3, 1979

[51] Int. Cl.³ .................. F16H 35/18; G05G 1/02
[52] U.S. Cl. ............................ 74/10.33; 74/10.37
[58] Field of Search ............... 74/10.33, 10.37; 334/7; 200/5 E

[56] References Cited

U.S. PATENT DOCUMENTS

| | | | |
|---|---|---|---|
| 2,205,844 | 6/1940 | Clements | 74/10.27 |
| 2,305,805 | 12/1942 | Caletti | 74/10.27 X |
| 2,365,088 | 12/1944 | Lane et al. | 74/10.33 |

FOREIGN PATENT DOCUMENTS 525128  8/1940  United Kingdom ................. 334/7

Primary Examiner—Allan D. Herrmann
Attorney, Agent, or Firm—Haseltine and Lake

[57] ABSTRACT

A push-button type tuning apparatus comprises a frame structure having a pair of opposing support plates provided with support openings, push-buttons each comprised of a button and a slide plate fitted into the support openings in the pair of support plates in a slidable manner, and a resilient restriction member provided on at least one of the support plates and disposed near the slide plates. The restriction member urges the slide plates to press against one edge of the support opening thereby to restrict the positions of the push-buttons at lease when they are pushed, thereby ensuring accurate preset tuning and retuning.

4 Claims, 15 Drawing Figures

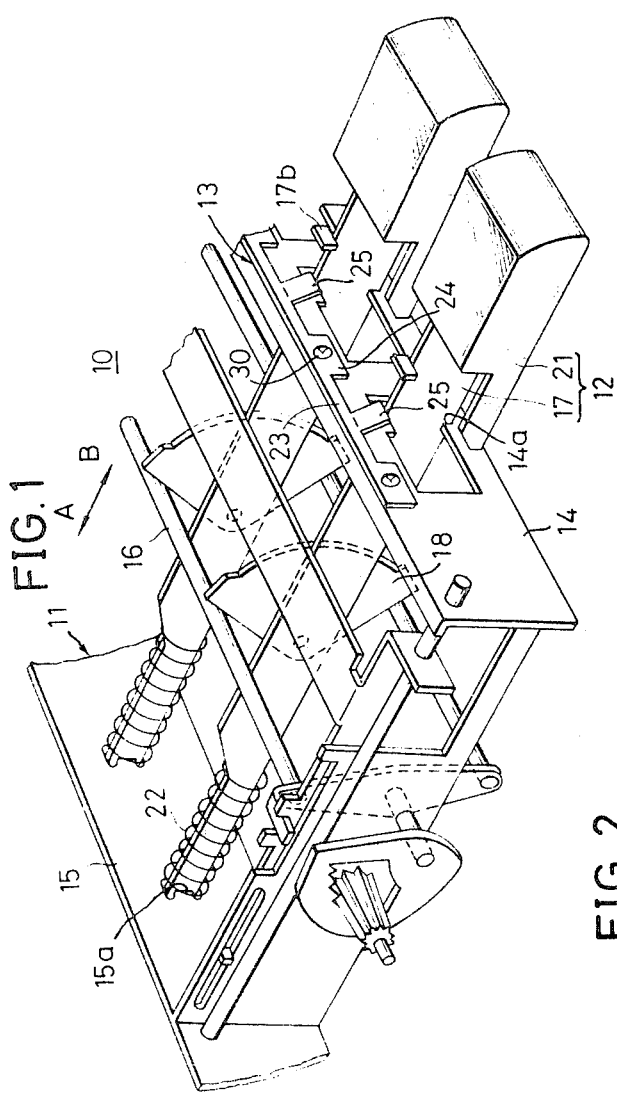
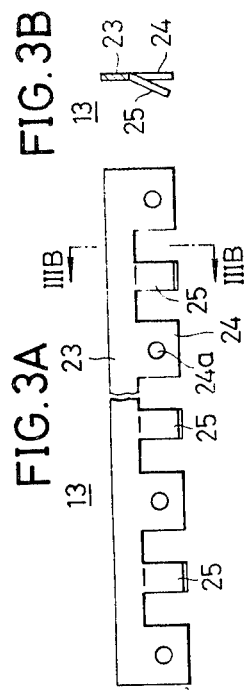
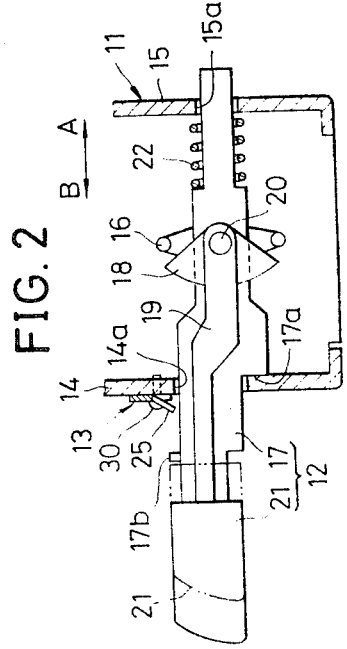

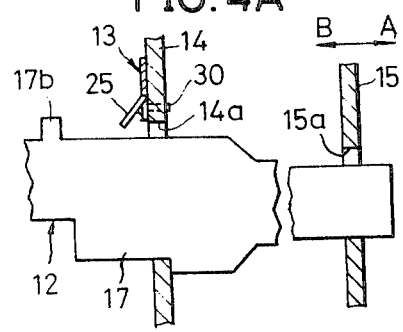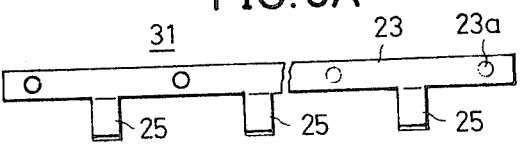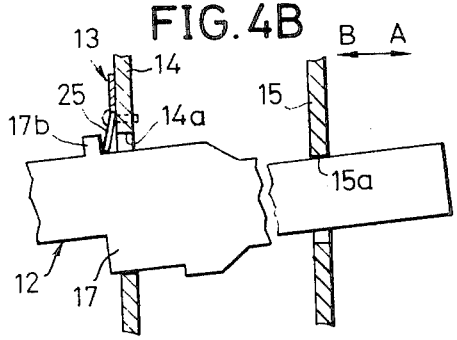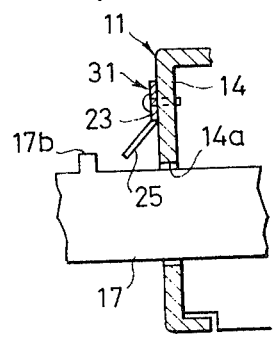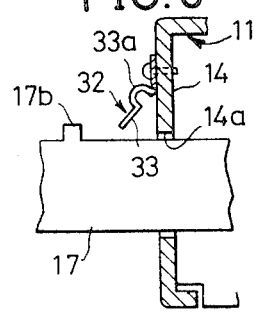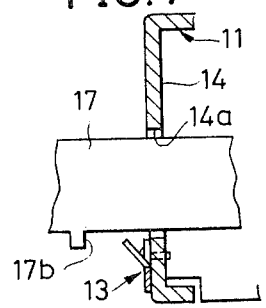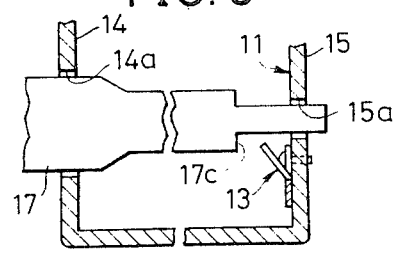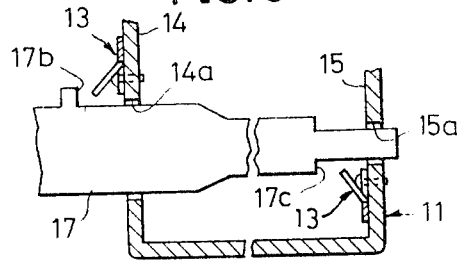

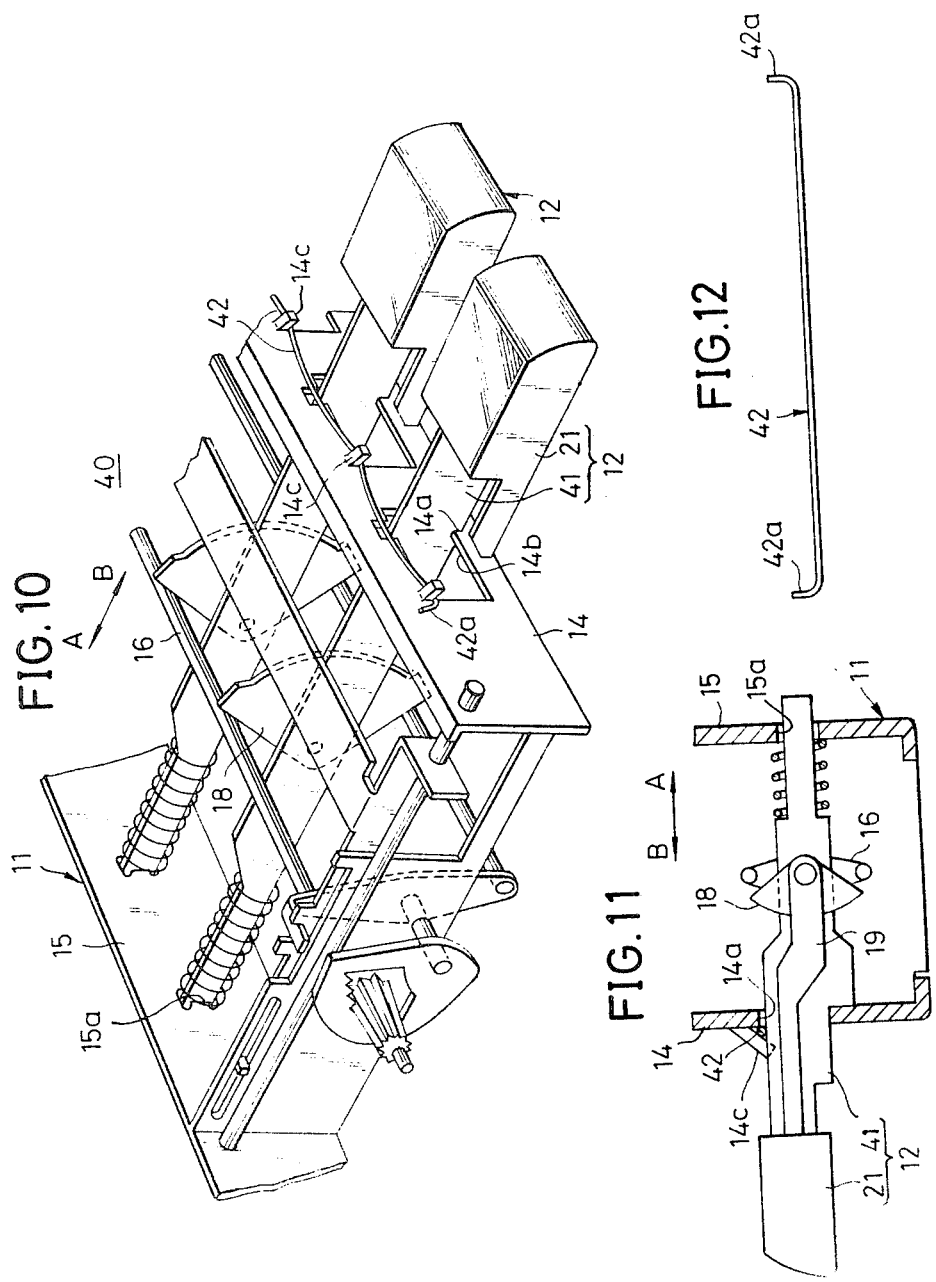

PUSH-BUTTON TYPE TUNING APPARATUS

BACKGROUND OF THE INVENTION

The present invention relates generally to a push-button type tuning apparatuses, and more particularly to a push-button tuning apparatus wherein improved tuning accuracy and a pleasant touch sensation in the pushing operation are attained by eliminating play from the push-button.

In general, a push-button type tuning apparatus is constructed with its push-buttons slidably fitted in support openings formed in a pair of support plates confronting each other in a frame structure and preset tuning and reset tuning (re-tuning) are performed by pushing the push-buttons. Due to the above described arrangement, however, there inevitably exists a certain amount of play between the push-button and the support openings. Accordingly, there arises a problem in that the push-button is apt to be erroneously positioned when pushed because of this play. This results in tuning error. Furthermore, the push-button is apt to wobble when being pushed and this is perceived as an unpleasant sensation by the finger.

In order to overcome the above described problems, a push-buton tuning apparatus has been proposed wherein each push-button comprises two slide plates confronting each other with a pin embedded in one slide plate fitting into a slot formed in the other slide plate, the slot being inclined with respect to the sliding direction thereof. When the push-button is pressed, the pin rides on the slope of the inclined slot forcing the slide plates to maintain contact with the upper and lower edges of the support openings. Therefore, the play in the slide plates is eliminated and the accuracy in preset and reset tuning improved accordingly. However, since each push-button has two separate plates, the tuner apparatus becomes complicated, bulky and expensive to fabricate.

There has been proposed and put into practice another push-button type tuning apparatus in which the push-button has a single plate and an auxiliary plate is fixed to at least one support plate so as to project somewhat into a support opening, thus supporting a push-rod (plate) between one edge of the support opening and one edge of the auxiliary plate in what is intended to be a play-free arrangement. However, since the auxiliary plate is a rigid body, it is difficult to eliminate play this apparatus in actual practice.

SUMMARY OF THE INVENTION

Accordingly, it is a general object of the present invention to provide a novel and useful push-button type tuning apparatus in which the above described difficulties have been overcome.

Another and specific object of the present invention is to provide a push-button type tuning apparatus in which a restriction member is fitted to a support plate of the apparatus and is adapted to push the slide plates of the push-buttons in one direction thus restricting the unwanted motion thereof. With this construction, play is eliminated from the push-buttons during the pushing operation, thus ensuring high accuracy in preset and reset tuning and improving the tactile sensation perceived by the finger in pressing the push-button.

Still another object of the present invention is to provide a push-button type tuning apparatus which can be easily realized by modifying a known type of tuner apparatus. Accordingly, the present application has relatively wide application and can be adapted inexpensively.

Other objects and further features of the invention will be apparent from the following detailed description with respect to the preferred embodiments of the present invention when read in conjunction with the accompanying drawings.

BRIEF DESCRIPTION OF THE DRAWINGS

In the drawings:

FIG. 1 is a perspective view, with parts cut away, showing a first embodiment of a push-button type tuning apparatus according to the present invention;

FIG. 2 is a side view, in vertical section, of the push-button type tuning apparatus illustrated in FIG. 1;

FIG. 3A is a front view, with parts cut away, showing a restriction plate incorporated in the apparatus shown in FIG. 1;

FIG. 3B is a side view, in vertical section, taken along the lines IIIB—IIIB in FIG. 3A, as viewed in the arrow direction;

FIGS. 4A and 4B are side views, in vertical section, showing the operation of an important part of the apparatus shown in FIG. 1;

FIG. 5A is a front view, with parts cut away, showing another embodiment of a restriction plate;

FIG. 5B is a side view, in vertical section, showing the state of attachment of an important part of the restriction plate shown in FIG. 5A;

FIG. 6 through FIG. 9 are side views, in vertical section, showing important parts of still other embodiments of the push-button type tuning apparatus according to the present invention;

FIG. 10 is a perspective view, with parts cut away, showing a second embodiment of a push-button type tuning apparatus according to the present invention;

FIG. 11 is a side view, in vertical section, of the apparatus shown in FIG. 10; and FIG. 12 is a front view of a wire spring fitted to the apparatus shown in FIG. 10.

DETAILED DESCRIPTION OF THE INVENTION

The structure of a first embodiment of a push-button type tuner according to the present invention will be described with reference to FIG. 1 through FIG. 3.

Referring to FIG. 1, a push-button type tuning apparatus or tuner 10 comprises a square frame structure 11 made from plate metal, a plurality of push-buttons 12, and a restriction plate 13.

The front and rear sides of the frame structure 11 are constituted of support plates 14 and 15, respectively. The support plate 14 is provided with a plurality of openings 14a and the support plate 15 is provided with an equal number of opposing openings 15a.

A pair of rods 16 is provided between the opposite side plates of the frame structure 11 (only one side plate being shown in FIG. 1). This pair of rods 16 is adapted to undergo rotating or swinging displacement in an amount determined by memory pieces 18 described below.

Each push-button 12 comprises a single slide plate 17 to which one of the segmental memory pieces 18 is supported by a pin 20 so as to swing freely thereabout. Further, a lock plate 19 is also supported by the pin 20 so as to undergo free displacement in a plane perpendicular to the slide plate 17, and a button 21 fixed to the slide plate 17 at the forward end thereof. The push-button 12 is normally urged to move in the direction indicated by arrow B in FIGS. 1 and 2 by a coil spring 22 loosely fitted around the slide plate 17 at its rear part. The motion of the push-button 12 is, however, limited by a step 17a which comes into contact with the support plate 14. The slide plate 17 has a projection 17b formed on the upper edge thereof at a point somewhat separated from the front surface of the support plate 14 at the time the slide plate 17 is urged to its limit by the coil spring 22.

The push-button type tuner 10 is provided with a restriction plate 13 press-formed from springy sheet metal. The restriction plate 13 is comprised of a beam part 23 provided along its length with plate parts 24 and resilient restriction lugs 25 bent forward at a specific angle, the plate parts 24 and lugs 25 being arranged alternately to project from the beam part 23, as illustrated in FIG. 3A and FIG. 3B. Each plate part 24 has a hole 24a formed therein. This restriction plate 13 is fastened above the support openings 14a on the front surface of the support plate 14 by screws 30 passed through the holes 24a, as illustrated in FIG. 1.

When given button 21 is not being pushed, the lower edge of the associated restriction lug 25 is in a position close to the upper edge of the slide plate 17 but separated from the projection 17b by a relatively large distance, as illustrated in FIG. 2 and FIG. 4A. In FIG. 2, the button 21 of the push-button 12 as shown to be independently pulled along the slide plate 17 in the arrow direction B from the position indicated by the two-dot chain line to the position indicated by the solid line. This readies the mechanism for setting of the tuning memory and, in this state, the memory piece 18 is freed from the locking action of the lock plate 19 and is made freely rotatable.

When a given button of the tuner is to be preset for the tuning of a certain station, the station is first tuned in by means of a tuning knob etc (not shown) and then the button 21 is pushed in the direction indicated by arrow A. This causes the slide plate 17 to slide in the same direction and the memory piece 18 to come into contact with the rods 16 which, being linked to the tuning knob, are now at a position corresponding to the station which has been tuned in. Contact with the rods 16 causes the memory piece 18 to rotate to a position conforming with the position of the rods 16. Then the button 21 is further pressed along the slide plate 17 independently thereof in the direction A. As the button 21 moves alone, the lock plate 18 is guided at its free end by the button and is forced to undergo rotational displacement in the direction toward the slide plate about the pin 20. As a result, the memory piece 18 is clamped between the slide plate 17 and the lock plate 19, thus completing preset tuning to the desired station.

When the push-button 12 reaches the end of its sliding motion in the direction A, the projection 17b on the slide plate 17 reaches the position illustrated in FIG. 4B. The projection 17b abuts against the restriction lug 25 of the position restriction plate 13 and forces the lug 25 to make resilient rotational displacement in the counter-clockwise direction. As the restriction lug 25 undergoes resilient displacement, the lower edge of the restriction lug 25 moves downward and comes into contact with the upper edge of the slide plate 17, and furthermore, presses the slide plate 17 against the lower edge of the support opening 14a. At this moment, the force of reaction acting on the restriction lug 25 causes the portion of the beam part 23 between adjacent pairs of plate parts 24 to undergo a slight upward resilient deformation. Consequently, in the final stage of presetting a given push-button, the position of the slide plate 17 is restricted at both ends, namely by positive contact with the lower edge of the support opening 14a at its forward end and with the upper edge of the support opening 15a at its rearward end, as illustrated in FIG. 4B.

When pushing of the button 12 is discontinued, the push-button 21 slides back in the direction B up to the position shown in FIG. 2 and the restriction lug 25 and the beam part 23 of the restriction plate 13 are resiliently restored to their original shape.

When the station to which a push-button has been preset is to be tuned in, the push-button 12 is similarly pushed to slide in the direction of arrow A. The memory piece 18 locked with respect to the push plate 17 as described above abuts on one or the other of the swingable rods 16 and, regardless of the position of the rods 16 at the time of contact, forces the swingable rods 16 to swing to the position they were in at the time of the presetting operation described above, whereby the same station is again tuned in. At the time the push-button 12 is pushed to its limit during this operation, the slide plate 17 is restricted of its position by the action of the restriction lug 25 as illustrated in FIG. 4B. As this position is exactly the same as the position at the time of the preset tuning operation, the desired station is tuned in with high accuracy.

Here, although the restriction plate 13 and its restriction lugs 25 are formed as one unitary body, the push-buttons 12 are separate members which ordinarily would not press against the support openings 14a in precisely the same manner. In this invention, however, the beam part 23 is adapted to undergo deflectional deformation at the time one of the slide plate 17 and the associated restriction lug 25 make contact. As a result, the restriction lug 25 is allowed to undergo relief displacement in the upward direction, thus compensating for any variation that would otherwise exist among the push-buttons in their state of contact. Consequently, all of the push-buttons 12 are uniformly restricted in their positions by the lower edges of the support openings 14a and, consequently, preset and reset tuning can be uniformly carried out by the push-buttons.

FIG. 5A shows a modified restriction plate 31 and FIG. 5B shows how the plate 31 shown in FIG. 5A is attached. In FIGS. 5A and 5B, those parts which are the same as corresponding parts in FIG. 2 through FIG. 4B are designated by like reference numerals.

The restriction plate 31 differs from the above described restriction plate 13 in that it has no plate parts 24 and is screw-fastened to the support plate 14 of the frame structure 11 at holes 23a formed in the beam part 23.

FIG. 6 through FIG. 9 show important features of other embodiments of the push button type tuner apparatus according to the present invention. In FIG. 6 through FIG. 9, those parts which are the same as corresponding parts in FIG. 2 are designated by like reference numerals. Detailed description of such parts will be omitted.

Referring to FIG. 6, a restriction lug 33 of a restriction plate 32 has a U-shaped part 33a. Any variation in position among the upper edges of the slide plates 17 of the push-buttons 12 is compensated for by resilient displacement of the U-shaped part 33a. Accordingly, all the push-buttons 12 are restricted at exactly the same position, with a resulting improvement in preset and reset tuning accuracy as will as an enhancement of the tactile feeling sensed by the finger in the pushing operation.

In the embodiment illustrated in FIG. 7, the restriction plate 13 is disposed below the support opening 14a of the support plate 14. In conformance with this arrangement, the slide plate 17 is provided with the projection 17b on the lower edge thereof. The slide plate 17 is restricted in a manner similar to that shown in FIGS. 4A and 4B except that it is presssd against not the lower edge but the upper edge of the support hole 14a by the restriction plate 13.

In the embodiment illustrated in FIG. 8, the restriction plate 13 is fixed to the rear support plate 15 at a position below the opening 15a. Accordingly, when the push-button is pushed, the restriction plate 13 engages with a rear step 17c of the slide plate 17, thus pressing the slide plate 17 against the upper edge of the support opening 15a and restrict its position.

The embodiment illustrated in FIG. 9 is a combination of the embodiments shown in FIG. 4A and FIG. 8. One restriction plate 13 is attached to the support plate 14 and another to the support plate 15. This construction even further improves the precision with which the push-button 12 is positionally restricted.

The above described embodiments can easily be applied with respect to known types of push-button type tuners merely by additionally forming the step part 17b in the slide plate 17 and providing the restriction plate 13, 31, or 32. This invention therefore has much potential for wide application.

Moreover, the restriction plates 13, 31, and 32 are not limited to ones made from strips of springy sheet metal as described in the above embodiments but may alternatively be formed from a synthetic resin plate material having resiliency.

Furthermore, the restriction plates 13, 31, and 32 may be fastened by rivets or the like instead of by the screws 30.

FIG. 10 and FIG. 11 show a second embodiment of the push-button type tuner apparatus according to the present invention. In FIG. 10 and FIG. 11, those parts which are the same as corresponding parts in FIG. 1 and FIG. 2 are designated by like reference numerals. Detailed description of such parts will not be repeated.

In tuner apparatus 40 of the present embodiment, the push-button 12 has a slide plate 41 which is similar to the above described slide plate 17 but does not have the projection 17b. Moreover, instead of one of the restriction plates 13, 31, or 33, this embodiment uses a single straight wire spring 42.

Referring to FIG. 10, a plurality of engagement lugs 14c are cut and raised on the upper edges of openings 14b formed in the support plate 14 of the frame structure 11. The engagement lugs 14 are provided on either side of each push-button 12 so as to extend diagonally downwards inside of the opening 14b. The opening 14b is provided with support openings 14a.

The wire spring 42 has bent portions 42a at opposite ends thereof, as illustrated in FIG. 12. This wire spring 42 is supported alternately by the upper edges of the slide plates 41 of the push-buttons 12 and the lower surfaces of the engagement lugs 14c, and moreover, by the engagement of its bent portions 42a with the rightmost and leftmost lugs 14c. In this manner, the wire spring 42 is positively retained on the front surface of the support plate 14. The portions of the wire spring 42 between the adjacent engagement lugs 14c are forcibly pressed upward into an arcuate shape and the resulting downward resilient force acts to depress the slide plates 41 against the lower edges of the support openings 14a, whereby the slide plates 41 are deprived of their play in both the lateral direction and in the vertical direction.

Accordingly, when the button 21 is pushed to slide the push-button in the direction of arrow A for carrying out preset tuning and retuning, the slide plate 41 slides only in the direction A and does not move in the vertical or lateral direction, since all of its play in these directions has been taken up by the wire spring 42. Therefore, the push-button 12 always assumes the same position when pushed, thus ensuring high-accuracy tuning.

Differently from the above described restriction plates 13, 31, and 32, the wire spring 42 can be attached without screws, thus facilitating the work of attachment. Accordingly, positional restriction can be realized with a single component and a very simple structural arrangement. Furthermore, the wire spring 42 itself can be manufactured with ease, thus making it possible to manufacture the tuner apparatus according to this embodiment at low cost.

Furthermore, the push-button 12 is constantly subject to the depressing force of the wire spring 42 so as to be free from vertical and lateral play at all positions thereof. Since, therefore, the push-button 12 does not wobble during the pushing operation, the sensation of touch perceived by the finger is most pleasant and is, moreover, almost identical for all of the push-buttons.

Additionally, the upper edge of the slide plate 41 need not be a flat surface but may slope upwardly near the button 21. In such case, the wire spring 42 rides up the slope as the push-button 12 is pushed in the direction A and applies progressively stronger pressing force on the push-button 12 to restrict it more positively and accurately.

Further, this invention is not limited to these embodiments but various variations and modifications may be made without departing from the scope of the invention.

What is claimed is:

1. A push button type tuning apparatus comprising: a frame structure having a pair of front and rear support plates opposing each other across an interval, each of said support plates having a plurality of in line support openings formed therein; a plurality of slidable push buttons each comprising a slide plate fitted into said support openings in said support plates, a button provided at one end of said slide plate projected from the front support plate, and a projection provided on the slide plate between the front support plate and the push button; a resilient restriction member provided on the front support plate on the side confronting said projection, said resilient restriction member having a plurality of leaf spring lugs cut and raised to a predetermined angle, said leaf spring lugs being resiliently deformed to undergo resilient displacement by said projection prior to said push button reaching a position to select a station, said resilient restriction member further having a mounting part for mounting on the front support plate, said resilient restriction member being deformed by the projection upon sliding of the push button and pushing the slide plate of the push button against one edge of the support openings.

2. A push button type tuning apparatus as claimed in claim 1, wherein: said resilient restriction member is a leaf spring plate.

3. A push button type tuning apparatus comprising: a frame structure having a pair of front and rear support plates opposing each other across an interval, each of said support openings being formed in-line; a plurality of push buttons each comprising: a slide plate fitted into said support openings in said support plates in a slidable manner, and a button provided at one end of said slide plate projected from the front support plate; and restriction means formed of an engaging means having a plurality of engaging parts projected in line and in spatial relationship to the plurality of support openings, between said support openings and on both sides thereof in said front support plate, and a wire spring engaged with the engaging parts and intersecting the plurality of slide plates, said restriction means urging said slide plate to be constantly pressed against one edge of said support openings by said wire spring.

4. A push button type tuning apparatus as claimed in claim 3, wherein: the engaging parts of the engaging means are parts of the front support plate cut and raised to a predetermined angle.

* * * * *